United States Patent [19]

Hacke et al.

[11] Patent Number: 4,461,962

[45] Date of Patent: Jul. 24, 1984

[54] SQUARE-WAVE SYMMETRY CORRECTOR

[75] Inventors: Joseph F. Hacke, Blackwood; Arthur J. Banks, Cherry Hill; Lucas J. Bazin, Vincentown, all of N.J.

[73] Assignee: RCA Corporation, New York, N.Y.

[21] Appl. No.: 342,801

[22] Filed: Jan. 26, 1982

[30] Foreign Application Priority Data

Jan. 26, 1981 [GB] United Kingdom ............... 8102284

[51] Int. Cl.³ .................. H03K 5/01; H03K 5/08; H03K 3/017
[52] U.S. Cl. .................................. 307/265; 307/359; 307/268; 307/234
[58] Field of Search ............... 307/264, 268, 350, 358, 307/359, 530, 494, 546, 503, 265, 266, 267

[56] References Cited

U.S. PATENT DOCUMENTS

| 3,500,067 | 3/1970 | Davis et al. | 307/540 |
| 3,502,911 | 3/1970 | Lehman | 307/261 |
| 3,588,708 | 6/1971 | McBride | 307/261 |
| 3,610,955 | 10/1971 | Blaser | 307/350 |
| 3,626,209 | 12/1971 | Chandos | 307/268 |
| 3,636,457 | 1/1972 | Hart, Jr. et al. | 307/261 |
| 3,649,850 | 3/1972 | Davis | 307/261 |
| 3,701,937 | 10/1972 | Combs | 307/265 |
| 3,721,835 | 3/1973 | Hess | 307/264 |
| 3,916,342 | 10/1975 | Higuchi et al. | 307/268 |
| 4,034,236 | 7/1977 | Aveneau et al. | 307/261 |
| 4,278,901 | 7/1981 | Kishi | 307/546 |
| 4,305,010 | 12/1981 | Wise | 307/265 |
| 4,338,580 | 7/1982 | Gay | 332/31 |

Primary Examiner—John S. Heyman
Assistant Examiner—Timothy P. Callahan
Attorney, Agent, or Firm—E. M. Whitacre; W. H. Meise

[57] ABSTRACT

A circuit including emitter-coupled transistors improves the symmetry of an applied square wave. A limiter in the collector circuit limits the paraphase output voltage excursion. Changes in energizing voltage affect the current in the limiter and cause incremental changes in the output duty cycle. A compensator includes a voltage divider coupled between the output terminals for producing a control voltage related to the output signal amplitude. The control voltage controls a current source coupled to joined emitters for creating an offsetting current through the limiter.

6 Claims, 2 Drawing Figures

SQUARE-WAVE SYMMETRY CORRECTOR

This application relates to a circuit for improving the symmetry of square-wave signals.

Many applications require square-wave signals with amplitude symmetry and with time-base or duty-cycle symmetry for low harmonic content. A particular use for such square-waves is as a switching signal for the switches of a modulator. In the chroma modulators for a television signal, color-representative signals are applied to a first input and square-wave signals are applied to a second input. The duty-cycle symmetry reduces the amount of even-order harmonic content of the resulting modulated signal, which is desirable for ease of filtering. Amplitude symmetry is also desirable for maintaining a low harmonic content resulting from asymmetric drive of the modulator switches.

A hardlimiter automatic symmetry control is described in U.S. Pat. No. 3,721,835 issued Mar. 20, 1973 to Hess. This patent describes an operational amplifier using antiparalleled limiter diodes coupled between the output and its inverting input for creating a clipped or limited output signal. The limited signal is applied to a paraphase amplifier which generates mutually out-of-phase square-wave signals. These are averaged or low-pass filtered and combined to generate a control signal which is applied to the non-inverting input of the operational amplifier for duty-cycle control. This arrangement may be subject to symmetry variations which are dependent upon the applied energizing voltages, and the output signal voltage excursions may not be about values which are suitable for application to the use circut, such as a modulator.

SUMMARY OF THE INVENTION

A circuit for improving the symmetry of a square-wave includes emitter-coupled transistors supplied with current from a controllable current source. A limiter is coupled in the collector circuit of the transistors, and includes at least one reference voltage source and a pair of diodes having a junction to which an anode and cathode are connected. The junction is connected to a collector. At least a portion of the controlled current flows through one of the diodes in one state of the circuit. A resistor is coupled to a source of energizing voltage and to a collector for supplying current to the other of the pair of diodes in the other state of the circuit. A compensator changes the controlled current in response to changes in the energizing voltage, to maintain symmetry of the diode conduction.

DESCRIPTION OF THE INVENTION

Figure 1:
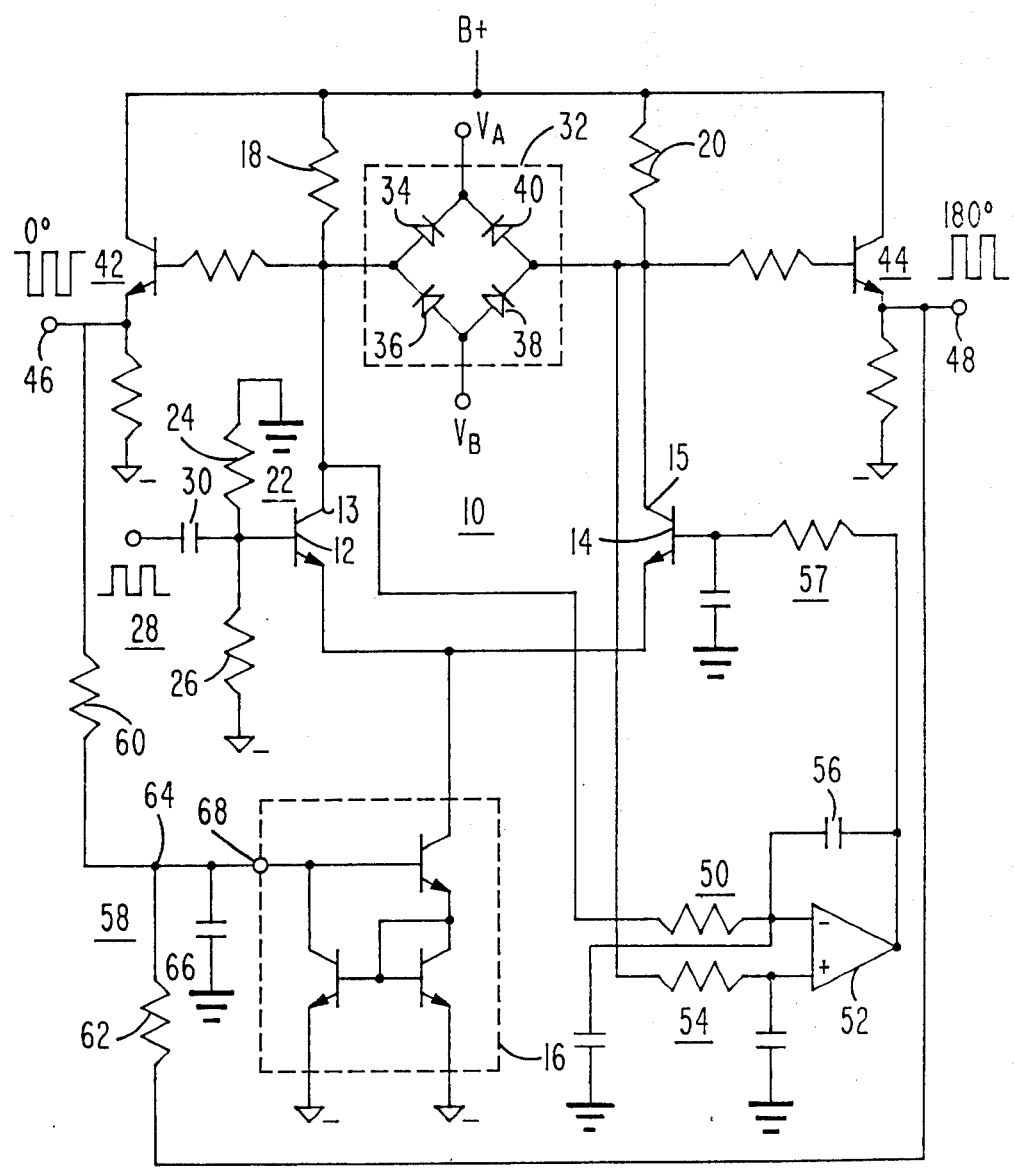
FIG. 1 is a schematic diagram of a circuit in accordance with the invention.

FIG. 1 illustrates generally an emitter-coupled differential amplifier 10 including bipolar transistors 12 and 14 having collectors 13 and 15, respectively. A controllable current source 16 supplies a controllable current to the joined emitters of transistors 12 and 14. A collector load resistor 18 is coupled from a source B+ of energizing voltage to collector 13 of transistor 12. A load resistor 20 joins collector 15 of transistor 14 to B+. The base of transistor 12 is supplied with bias from a voltage divider 22 including resistors 24 and 26. Trapezoidal voltage signals (hereinafter referred to as square-waves) illustrated as 28 are applied from a source (not shown) to the base of transistor 12 by way of a coupling capacitor 30. The square-wave signals are compared with a reference voltage applied to the base of transistor 14 from a feedback loop. When square-wave input signal 28 is relatively positive, transistor 12 is rendered conductive and transistor 14 nonconductive. The gain of amplifier 10 is high enough so that in the absence of limiter 32, the collector voltages of transistors 12 and 14 would swing from B+ to approximately the base voltages of the transistors as the transistors go from cutoff to saturation.

Limiter 32 includes first and second voltage sources $V_a$ and $V_b$, where $V_a$ is more positive than $V_b$. A diode 34 has its anode coupled to the collector of transistor 12 and its cathode coupled to source $V_a$. A diode 36 has its cathode coupled to the anode of diode 34 and its anode coupled to source $V_B$. Similarly, diodes 38 and 40 are coupled cathode-to-anode between sources $V_a$ and $V_b$, and their juncture is coupled to the collector of transistor 14.

Buffer emitter-followers 42 and 44 couple limited square-wave signals from the collectors of transistors 12 and 14, respectively, to paraphase output terminals 46 and 48. The collector of transistor 14 is coupled by a low-pass filter 54 to the non-inverting input of an operational amplifier 52. Similarly, the collector of transistor 12 is coupled by a low-pass filter 50 to the inverting input of amplifier 52, coupled with a capacitor 56 as a Miller integrator. The output of amplifier 52 is coupled to the base of transistor 14 through a low pass filter 57.

In operation, transistors 12 and 14 alternately conduct the current from source 16. During a first state defined by conduction of transistor 12 and non-conduction of transistor 14, the voltage at collector 13 tends to drop (move in a negative direction) towards the voltage at its base, and the voltage at collector 15 rises towards B+. When the voltage at collector 13 decreases to $V_B - V_{36}$ diode 36 conducts a portion of the collector current of transistor 12. This determines a clamp voltage. The remainder of the collector current flows in resistor 18 in an amount determined by the difference between B+ and the voltage $V_B - V_{36}$ at which limiter 32 clamps. As the voltage at collector 15 rises, to $V_A + V_{40}$, diode 40 conducts and establishes a clamp voltage. At this clamp voltage, a current flows through diode 40 which is established by the value of resistor 20 and the difference between energizing voltage B+ and the clamp voltage.

The second state of operation has transistor 12 nonconductive, transistor 14 conductive, diode 34 conducting a current flowing through resistor 18, and diode 38 conducting a portion of the collector current of transistor 14. This state is symmetrical with the first state and is not described further.

These first and second states alternate at the rate of the applied input signal. Any duty-cycle error in the input signal results in a difference between the time durations of the first and second states. This, in turn, results in an increase of the average voltage at either collector 13 or 15 relative to the other. The path from the collectors through filters 50 and 54 to amplifier 52 and the base of transistor 14 is a degenerative feedback loop which adjusts the magnitude of the reference voltage at the base of transistor 14 in such a manner that the average values of the collector voltages, which are representative of the duty cycle, become matched with an accuracy proportional to the feedback loop gain.

Figure 2:
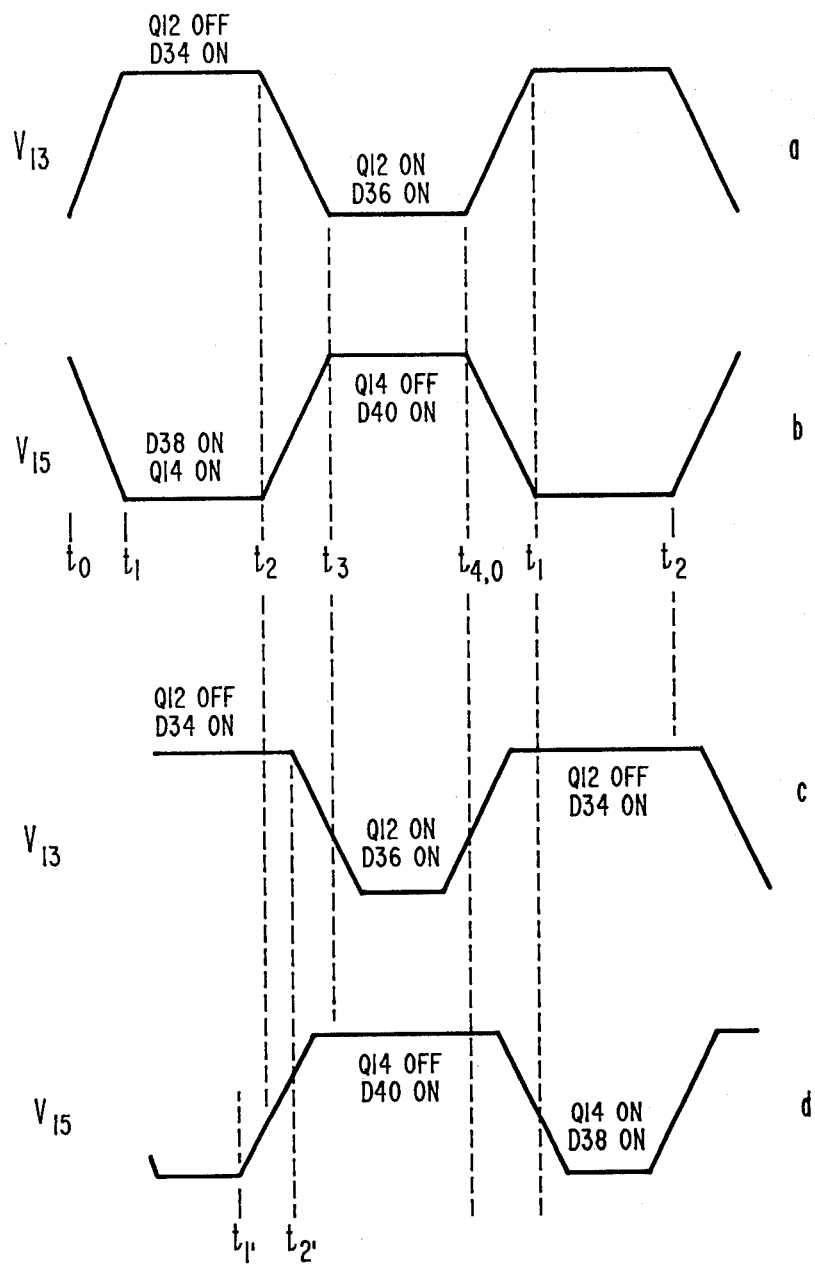
FIG. 2 illustrates waveforms aiding in understanding the invention.

The total current supplied to the emitters of transistors 12 and 14 is controlled. Consequently, the paraphase output signals at terminals 46 and 48 may be expected to remain in a constant relationship under normal conditions. FIG. 2a illustrates the voltage $V_{13}$ at collector 13, and FIG. 2b illustrates voltage $V_{15}$ at collector 15 under normal operating conditions. The rise and fall times of the signals are exaggerated for ease of comprehension. In FIG. 2, interval $T_1$-$T_2$ represents an interval in which under normal conditions transistor 12 is nonconductive, and transistor 14, and diodes 34 and 38 are conductive. Interval $T_3$-$T_4$ represents an interval in which transistor 14 is nonconductive and transistor 12, diodes 36 and 40 are conductive. Times $T_2$-$T_3$ and $T_4$-$T_1$ represent times during which the conductive states of the transistors are changing and in which the diodes of limiter 32 are nonconductive, for if the diodes were conductive, the collector voltages could not change. Thus, the total voltage excursion represented at the collector of either transistor is the sum of two diode offset voltages plus the difference between reference voltages VA and VB. Voltages $V_{13}$ and $V_{15}$ in FIGS. 2a and 2b represent the normal desired condition.

FIGS. 2c and 2d represent voltages $V_{13}$ and $V_{15}$, respectively, under a condition of increased B+ voltage. The collector current of transistors 12 and 14 is not influenced in the ON state by changes in the collector voltage, because the ON-state current is controlled by current source 16. However, a change in the B+ voltage can change the voltage across collector resistors 18 and 20 in both of the operating states of the circuit. For example, when B+ becomes more positive or increases in voltage, the voltage across resistor 20 increases in the first operating state when transistor 14 is conductive, and therefore resistor 20 supplies more of the current demand of transistor 14 so that less current flows through diode 38. At the same time, a larger voltage is impressed across resistor 18 and therefore more current flows through diode 34 than under the condition illustrated in FIGS. 2a and b. Thus, changes in B+ can affect the diode currents and can disturb the paraphase nature of the waveforms at the output terminals. FIGS. 2c and 2d illustrate the effect of an increased B+ voltage. The transition between states, which would normally be expected to occur in the interval $T_2$-$T_3$, occurs somewhat early for $V_{15}$ and somewhat late for $V_{13}$. Similarly, the change in state which would be expected to occur between time T4 and the next following time T1 occurs early for $V_{13}$ and late for $V_{15}$. As can be seen from FIG. 2, this results in distorted waveforms, with non-coincidence of transitions.

The effect of change in B+ on the transition timing can be understood by noting that the turn-off times of the diodes of each pair which nominally conduct simultaneously (34,38;36,40) must be simultaneous, for otherwise the respective collector voltages cannot begin to change. This in turn requires that the on-state currents in the diodes be matched. Starting from the condition in which transistor 12 is nonconductive and diode 34 conducts current flowing through resistor 18, and transistor 14 is conductive, and draws current from resistor 20 and makes up its current demand through diode 38, and considering that resistors 18 and 20 are of the same size, it is easy to see that in order to have simultaneous transitions, the current demand of transistor 14, and therefore the current produced by source 16, must be approximately twice the current in resistor 20. When the input signal causes transistors 12 and 14 to begin to switch conduction, transistor 12 begins to turn on and draws away from diode 34 a portion of the current then flowing in resistor 18. Simultaneously, the current flowing in transistor 14 decreases, thereby decreasing the amount of current required to flow through diode 38. When the currents in transistors 12 and 14 are equal, their collector currents will equal the currents then flowing in resistors 18 and 20. Thus, all the current flowing through resistor 18 flows through transistor 12 and all the current flowing through resistor 20 flows through transistor 14. At this time, no current is available to flow through the diodes of limiter 32 and the limiter turns off. In the case of an increase in the B+ voltage, more current is flowing through diode 34 at the beginning of the switching interval and therefore the switching of current from transistor 14 to transistor 12 must progress further in order to have transistor 12 absorb all of the current flowing through resistor 18, and therefore the switching of diode 34 is delayed to a time $T_2'$ as illustrated in FIG. 2c. At the same time, the larger initial current flowing in resistor 20 reduces the current demanded from diode 38 by transistor 14, so that the current in diode 38 is reduced to zero more quickly as the current demand of transistor 14 begins to decrease during the switchover on currents between the transistors. Thus $V_{15}$ begins to switch at time $T_1'$, which is earlier than normal. The explanation of the change in the switching times for the interval $T_4$-$T_1$ is similar to the above and needs no further elaboration.

A compensator 58 includes series-connected resistors 60 and 62 connected between output terminals 46 and 48. Since the output signals are paraphase, with one increasing while the other decreases, the controlling current into terminal 68 of current source 16 remains constant at a value determined by circuit parameters. A filter capacitor 66 is coupled to junction 64 to remove transients. The current into terminal 68 varies with the amplitude average of the square-wave output signals. This current varies in the same sense as the variations in B+ voltage; when B+ increases, the current into terminal 68 also increases. Increases in B+ voltage increase the current of source 16 applied to the emitters of transistors 12 and 14. Consequently, an increase in B+ which increases the current through resistors 18 and 20 thereby unbalancing the diode currents creates a corresponding increase in the collector current of the transistors which creates a compensating change in current in the diodes which tends to maintain coincidence of transitions in the output signals.

What is claimed is:

1. A circuit for improving the symmetry of a square wave, comprising:

first and second emitter-coupled transistors;

a first source of reference voltage;

a source of square waves the symmetry of which is to be improved;

a current source coupled to the emitters of said first and second transistors for controlling the current applied thereto;

coupling means coupled to the base of said first and second transistors, to said source of reference voltage and to said source of square waves for comparing the amplitude of said square waves with said reference voltage for switching said first and second transistors for alternate conduction for causing said current to alternately flow in the collectors of said first and second transistors;

a second source of reference voltage;

first switching means coupled to said collectors of said first and second transistors and to said second source of reference voltage for conducting at least a first portion of said current for clamping the collector of the one of said first and second transistors then conducting to a voltage determined by said second reference voltage and by the voltage drop across said first switching means when conducting the said first portion of said current;

a third source of reference voltage;

second switching means coupled to said third source of reference voltage and to said collectors of said first and second transistors for creating a clamp voltage determined by said third source of reference voltage and by the voltage drop across said second switching means;

a source of energizing voltage subject to variations;

resistance means coupled to said source of energizing voltage and to said collectors of said first and second transistors for conducting a second current to said second switching means during those periods in which one of said first and second transistors is non-conductive, said second current being variable in response to said variations in said energizing voltage thereby varying the symmetry of said square wave;

control voltage generating means coupled to said collectors of said first and second transistors for generating a control voltage indicative of the average value of the voltages at said collectors of said first and second transistors; and coupling means for coupling said control voltage to said current source for controlling said current through said current source to be in the same sense as the changes in said second current through said resistance means for thereby controlling said first portion current in said same sense for thereby equalizing the current through said first and second switching means for equalizing the voltages thereacross and thereby improving the symmetry of said square waves in the face of changes in said energizing voltage.

2. A circuit according to claim 1 wherein said first switching means comprises a pair of diodes having their anodes coupled to said second source of reference voltage and each one having a cathode coupled to a said collector of one of said first and second transistors.

3. A circuit according to claim 2 wherein said second switching means comprises a pair of diodes having their cathodes coupled to said third source of reference voltage and each having an anode coupled to a said collector of one of said first and second transistors.

4. A circuit according to claim 3 wherein said second source of reference voltage has a voltage more negative than that of said third source of reference voltages.

5. A circuit according to claims 1, 2, 3 or 4 wherein said control voltage generating means comprises integrating means for reducing transients.

6. A circuit according to claims 1, 2, 3 or 4 further comprising a feedback loop for averaging the voltages at a said collectors of said first and second transistor means and for applying it in a degenerative manner as said first reference voltage.

* * * * *